United States Patent [19]

Bujatti et al.

[11] 4,157,284

[45] Jun. 5, 1979

[54] PROCESS TO OBTAIN CONDUCTIVE AND RESISTIVE ELEMENTS IN MICROWAVE MICROCIRCUITS

[76] Inventors: Marina Bujatti, Via Grossi Gondi, 62, Rome, Italy, 00162; Carlo Misiano, Via G.B. Morgagni, 22, Rome, Italy, 00161; Enrico Simonetti, Piazza della Radio, 14, Rome, Italy, 00146

[21] Appl. No.: 864,639

[22] Filed: Dec. 27, 1977

[30] Foreign Application Priority Data

Dec. 28, 1976 [IT] Italy ............................... 52808 A/76

[51] Int. Cl.² .......................... C25D 5/02; C25D 5/10
[52] U.S. Cl. ....................................... 204/15; 29/620; 156/659; 204/40
[58] Field of Search .................... 204/15, 40; 29/620, 29/625; 156/659, 661

[56] References Cited

U.S. PATENT DOCUMENTS

| | | | |
|---|---|---|---|
| 3,217,209 | 11/1965 | Kinsella et al. | 204/15 |
| 3,256,588 | 6/1966 | Sikina et al. | 204/15 |
| 3,423,260 | 1/1969 | Heath et al. | 29/620 |
| 3,634,159 | 6/1972 | Croskery | 204/15 |

*Primary Examiner*—T. M. Tufariello
*Attorney, Agent, or Firm*—Holman & Stern

[57] ABSTRACT

A process for obtaining conductive and resistive elements in microwave circuits in which sequentially a layer of a thin film constituted by a high resistive material is deposited on an insulating substrate, a thin film of conductive material is deposited over the high resistence material, the high resistive film is removed by photoetching from areas which are to constitute resistive elements, a masking material is electrolytically grown on the areas constituting the resistive elements, a thick film of conductive material is electrolytically grown over the entire surface, a protecting material is deposited on areas to constitute conductive elements, the thick film of conductive material is removed by ionic erosion from areas unprotected in the previous step and residual protecting material is removed by differential chemical attack.

6 Claims, 7 Drawing Figures

PROCESS TO OBTAIN CONDUCTIVE AND RESISTIVE ELEMENTS IN MICROWAVE MICROCIRCUITS

BACKGROUND OF THE INVENTION

It is known that, at the present status of the art, the procedure to obtain microcircuit is usually constituted by a sequence of steps, processing thin films to obtain resistive elements, while processing thick films to obtain conductive elements.

Resistive elements are usually obtained through a chemical etching of an electrolytic film (about 10 $\mu$m thick) grown on the thin film predeposed on the substrate or alternatively through electrolytic growing of conductive areas appropriately prearranged.

SUMMARY OF THE INVENTION

A process for obtaining conductive and resistive elements in a microwave circuit according to the present invention describes a particular technological cycle constituted by a sequence of steps, each one being considered known by itself at the present status of art, but which as a whole constitutes a particular technological cycle which permits to overcome the cited inconveniences and so reaching the object of the invention.

It is therefore an object of the present invention to provide a novel processing cycle characterized by the fact that the resistive and conductive elements are embodied during the same processing step.

BRIEF DESCRIPTION OF THE DRAWINGS

The invention will be now described with reference to FIGS. from 1 to 7, showing the consecutive processing steps of the in producing a microcircuit element which in the figures is viewed in schematical cross-section.

The figures are just exemplifying and give only a schematical representation of the microcircuit element. More particularly, high dimensional rates occurring between the thicknesses of various layers has induced not to follow a specific scale.

DESCRIPTION OF A PREFERRED EMBODIMENT

Figure 1:
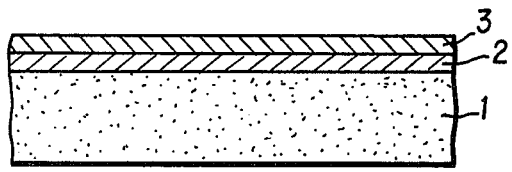

FIG. 1, shows a substrate 1 of insulating material on which are applied, in conventional manner, a thin layer 2 of resistive material and a thin layer of 3 of conductive material.

Figure 2:
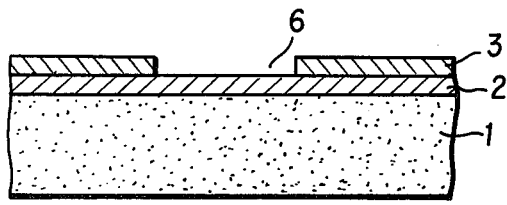

FIG. 2 shows the second step of the process consisting in the removal of the conductive layer 3 from areas 6 which will constitute the resistive element of the circuit.

Said step is effectuated by means of conventional technological process well known to those skilled in the art.

Figure 3:
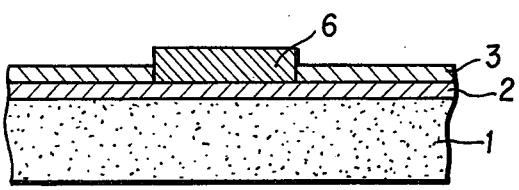

The next step is to protect by means of a suitable masking material the above mentioned resistive areas 6, as shown in FIG. 3.

Figure 4:
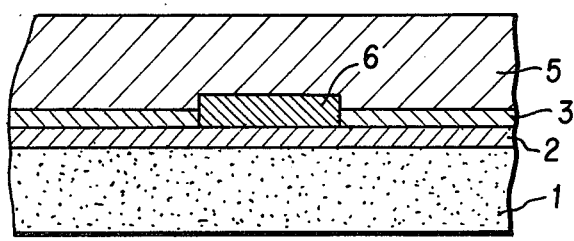

After this step, follows an electrolytic growing of a thick layer 5 of conductive material (FIG. 4) on the whole surface of the microcircuit.

Figure 5:
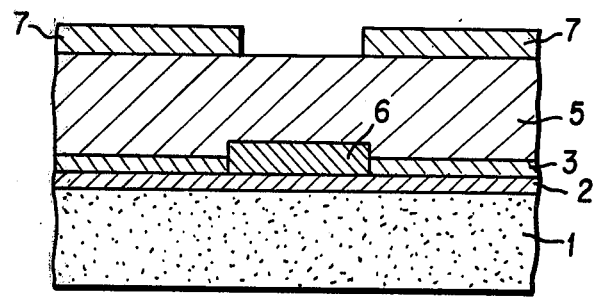

Proceeding with the process, as shown in FIG. 5, the areas which will constitute the conductive elements are protected by means of a suitable masking 7.

Figure 6:
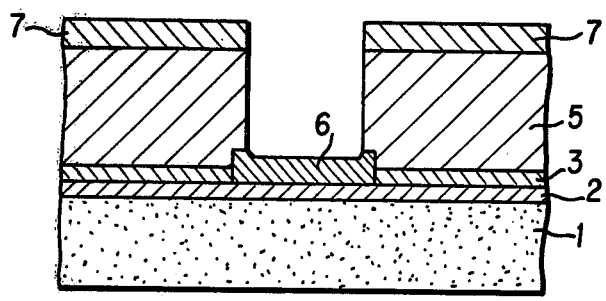

At this point, the areas not masked are removed through ionic erosion, as shown in FIG. 6;

Since the masking material too is somewhat albeit slightly eroded its thickness must be enough to safeguard the masking until the end of the erosion step.

Figure 7:
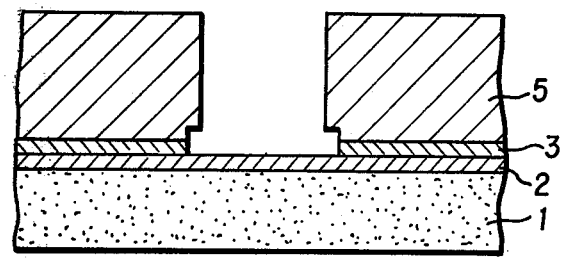

The final step consists in removing the residual of masking through a differential chemical etching (FIG. 7).

According to a plain illustrating purpose, without any intention of limiting the object of the invention, a typical process will be now described in the following example. On a substrate of Alumina ($Al_2O_3$) are applied under vacuum and through conventional techniques, a film of Ni Cr, characterized by a thickness of about 500–1000 Å and a resistance of 20–100 $\Omega/\square$, and a superimposed film of gold (Au) 2000 Å thick.

As shown in FIG. 2, gold is removed by chemical etching from areas 6 which will constitute the resistive elements. Nickel is employed as protecting masking material, growing it in an electrolytic manner, on the areas from which gold is removed.

This layer of Nickel is 1–2 $\mu$m thick.

As shown in FIG. 3, an electrolytic growth of gold 5 is provided on the whole circuit, obtaining a gold film about 10 $\mu$m thick. After a suitable photomasking, electrolytic Nickel will be grown on the areas which will constitute the conductive elements (FIG. 5).

By ionic erosion, gold, unprotected by the masking, is then removed.

At the end of this operation residuals of Nickel will be removed by differential chemical etching.

The present invention has been described with reference to a particular technological cycle but it must be stressed that the invention itself can be applied to operative cycles which differ from the cited cycle on the succession of steps or on the involved procedures without exceeding rights protected by the present invention.

What is claimed is:

1. A process to obtain conductive and resistive elements in a microwave microcircuit comprising:
   (a) depositing on an insulating substrate a layer of a thin film constituted by a high resistive material over which is deposed a layer of thin film also constituted by a high conductive material;
   (b) removing said high conductive film by means of photoetching from an area to constitute a resistive element;
   (c) electrolytically depositing, on said area constituting the resistive element, a masking material;
   (d) electrolytically depositing a layer of thick film of conductive material over the substrate;
   (e) electrolytically depositing, by means of a suitable masking, a protecting material deposed on an area to constitute a conductive element;
   (f) removing, by ionic erosion, said thick film of conductive material from an area which was unprotected by the masking provided in the previous step; and
   (g) removing, by differential chemical, attack, of residual protecting material.

2. A process according to claim 1 wherein said insulating substrate is made of Alumina.

3. A process according to claim 1 wherein said thin film of high resistive material is constituted by Ni Cr, having a thickness of about 500–1000 Å and having a resistance of 20–100 $\Omega/\square$.

4. A process according to claim 1 wherein said thin film of high conductive material is made of Au, having a thickness of 2000 Å.

5. A process according to claim 1 wherein said protecting masking material is made of Nickel which is grown electrolytically to a thickness of about 1–2 $\mu$m.

6. A process according to claim 1 wherein said thick film of conductive material is made of Au, 10 $\mu$m thick.

* * * * *